United States Patent
Terada et al.

(10) Patent No.: US 9,980,390 B2
(45) Date of Patent: May 22, 2018

(54) SUSPENSION BOARD WITH CIRCUIT ASSEMBLY SHEET

(71) Applicant: NITTO DENKO CORPORATION, Osaka (JP)

(72) Inventors: Naohiro Terada, Osaka (JP); Yoshito Fujimura, Osaka (JP); Tomoaki Okuno, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days. days.

(21) Appl. No.: 14/605,150

(22) Filed: Jan. 26, 2015

(65) Prior Publication Data

US 2015/0216039 A1    Jul. 30, 2015

(30) Foreign Application Priority Data

Jan. 30, 2014  (JP) ................. 2014-016065

(51) Int. Cl.
*H05K 1/03* (2006.01)
*H05K 1/11* (2006.01)
(Continued)

(52) U.S. Cl.
CPC ......... *H05K 3/0097* (2013.01); *H05K 1/0393* (2013.01); *H05K 1/118* (2013.01);
(Continued)

(58) Field of Classification Search
CPC ............ H05K 1/0271; H05K 2201/20; H05K 3/0097; H05K 1/056; H05K 3/0052; H05K 2203/1545; H05K 2201/0909; H05K 2201/0969; H05K 2203/0169; H05K 2201/09027; H05K 1/0269;
(Continued)

(56) References Cited

U.S. PATENT DOCUMENTS 5,687,479 A * 11/1997 Bennin ............... G11B 5/4833
                                                                29/885
7,307,853 B2 * 12/2007 Funada ............... H05K 3/0052
                                                                174/254
(Continued)

FOREIGN PATENT DOCUMENTS

| JP | 2011-049316 A | 3/2011 |
| JP | 2011-066147 A | 3/2011 |
| JP | 2013-055365 A | 3/2013 |

OTHER PUBLICATIONS

Notification of Reasons for Refusal issued by the Japanese Patent Office dated Aug. 29, 2017, in connection with Japanese Patent Application No. 2014-016065.

*Primary Examiner* — Ishwarbhai B Patel
(74) *Attorney, Agent, or Firm* — Edwards Neils LLC; Jean C. Edwards, Esq.

(57) ABSTRACT

A suspension board with circuit assembly sheet includes an assembly provided region provided with a plurality of suspension boards with circuits at spaced intervals to each other along one direction and a margin region provided at least at one side in a crossing direction with respect to the one direction of the assembly provided region. In the assembly provided region, a first opening portion is provided between the suspension boards with circuits that are adjacent to each other and in the margin region, a fragile portion is provided.

6 Claims, 10 Drawing Sheets

(51) Int. Cl.
    *H05K 1/18* (2006.01)
    *H05K 3/00* (2006.01)
    *G11B 5/48* (2006.01)
    *H05K 1/05* (2006.01)

(52) U.S. Cl.
    CPC ............ *G11B 5/486* (2013.01); *G11B 5/4853* (2013.01); *H05K 1/056* (2013.01); *H05K 1/189* (2013.01); *H05K 3/0052* (2013.01); *H05K 2201/05* (2013.01); *H05K 2201/0909* (2013.01); *H05K 2201/09027* (2013.01); *H05K 2201/0969* (2013.01); *H05K 2203/0169* (2013.01); *H05K 2203/1545* (2013.01)

(58) Field of Classification Search
    CPC .......... H05K 2201/09127; H05K 2201/09781; H05K 3/225; H05K 3/303; H05K 1/189; H05K 2201/09063; H05K 2201/09827; H05K 2201/09845; H05K 2201/09854; H05K 2203/0323; H05K 2203/0369; H05K 2203/167; Y10T 29/49126; Y02P 70/613
    USPC ................. 174/250–268; 361/749; 360/245.9
    See application file for complete search history.

(56) References Cited

U.S. PATENT DOCUMENTS

| | | | |
|---|---|---|---|
| 8,222,530 B2* | 7/2012 | Ishigaki | G11B 5/486 174/250 |
| 2004/0256150 A1* | 12/2004 | Barchmann | G06K 19/07743 174/266 |
| 2010/0155110 A1* | 6/2010 | Watanabe | H01L 21/561 174/255 |
| 2011/0061900 A1 | 3/2011 | Umetani et al. | |
| 2012/0152592 A1* | 6/2012 | Ishii | H05K 1/0268 174/250 |

* cited by examiner

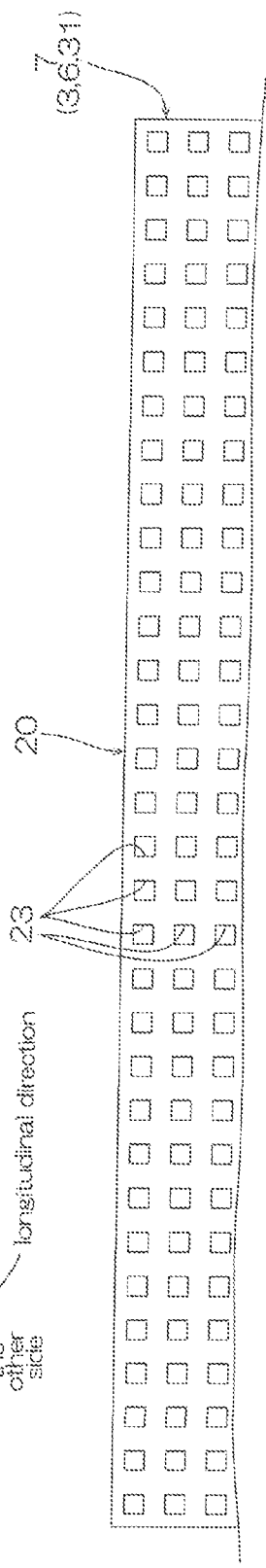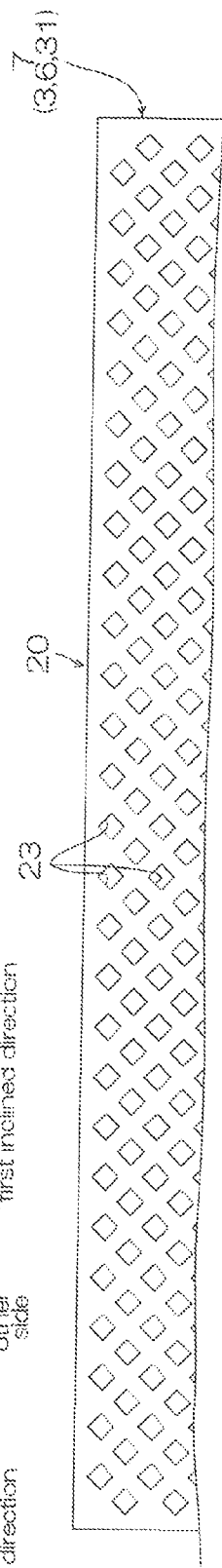

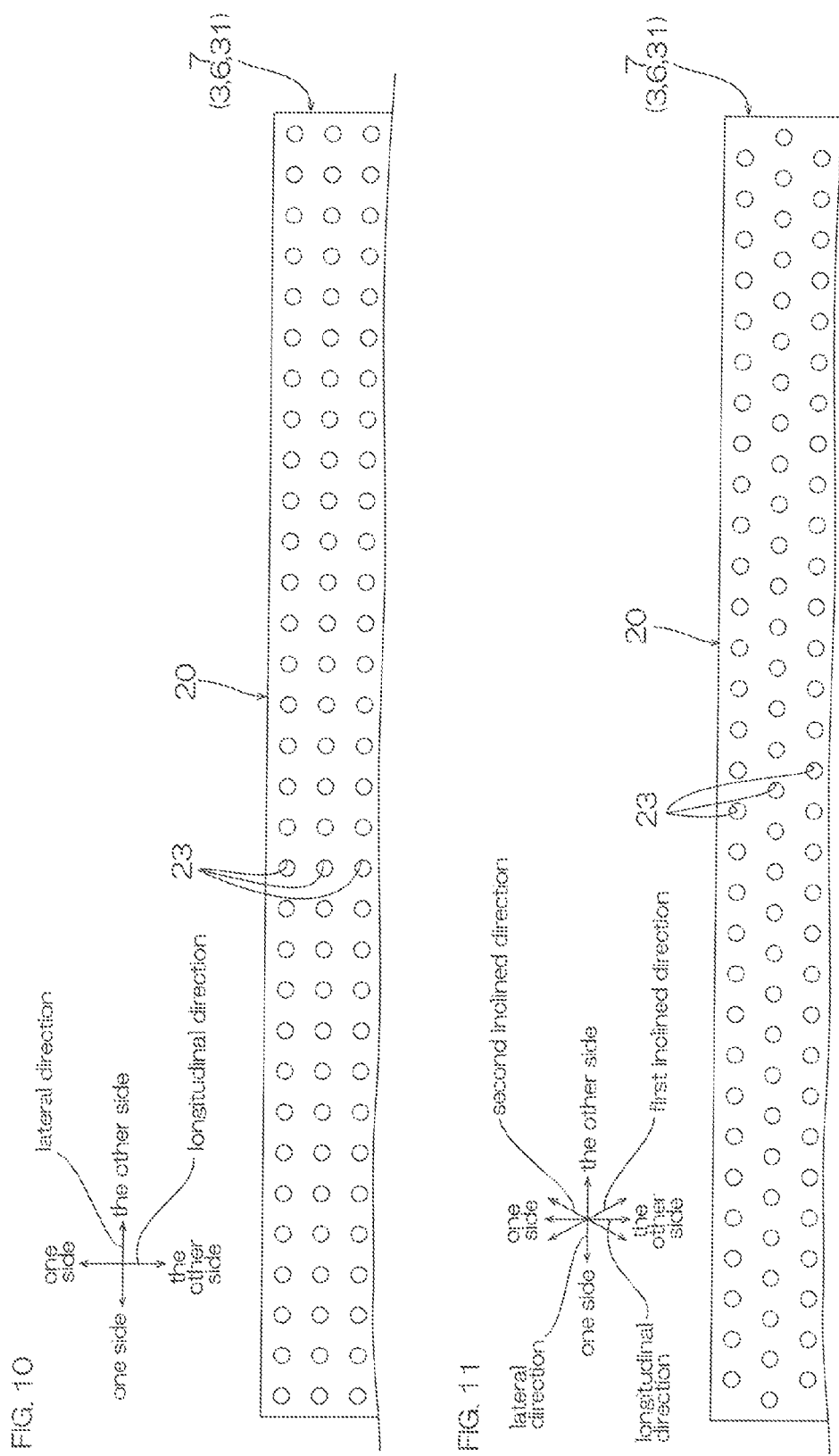

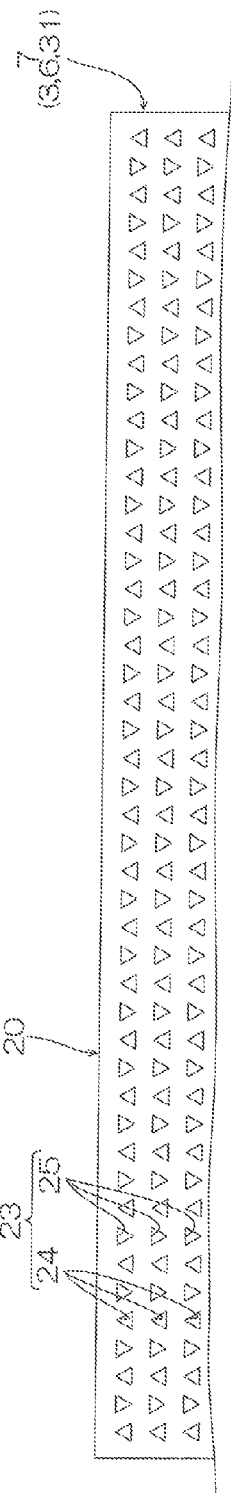

SUSPENSION BOARD WITH CIRCUIT ASSEMBLY SHEET

CROSS-REFERENCE TO RELATED APPLICATION

The present application claims priority from Japanese Patent Application No. 2014-016065 filed on Jan. 30, 2014, the contents of which are hereby incorporated by reference into this application.

BACKGROUND OF THE INVENTION

Field of the Invention

The present invention relates to a suspension board with circuit assembly sheet.

Description of Related Art

A suspension board with circuit assembly sheet including a plurality of suspension boards with circuits that are disposed in alignment has been conventionally known.

For example, a suspension board with circuit assembly sheet in which a base insulating layer, a conductive layer, and a cover insulating layer are sequentially laminated on a long-length metal sheet that is long in a lateral direction has been proposed (ref: for example, Japanese Unexamined Patent Publication No. 2011-066147).

In the suspension board with circuit assembly sheet in Japanese Unexamined Patent Publication No. 2011-066147, a plurality of suspension boards with circuits are provided at spaced intervals to each other along the lateral direction and gap grooves are formed between the suspension boards with circuits that are adjacent to each other.

The suspension board with circuit assembly sheet in Japanese Unexamined Patent Publication No. 2011-066147 is produced in the following manner: a metal sheet that is usually wound around a roll is conveyed in the lateral direction to a production device and is provided with a base insulating layer, a conductive layer, and a cover insulating layer in the production device, and thereafter, the gap grooves are formed therein by trimming the metal sheet.

SUMMARY OF THE INVENTION

In the suspension board with circuit assembly sheet in Japanese Unexamined Patent Publication No. 2011-066147, however, margin regions made of the metal sheet are provided in one end portion and the other end portion in a longitudinal direction of the metal sheet, while the plurality of the suspension boards with circuits and the gap grooves that separate the plurality of the suspension boards with circuits are provided in a midway portion in the longitudinal direction thereof.

Thus, the stiffness of the margin regions is higher than that of a region in which the plurality of the suspension boards with circuits and the gap grooves are provided. Then, there is a disadvantage that compared to the above-described region, warping easily occurs in the margin regions based on a residual stress when the metal sheet is wound around the roll. Thus, there is a disadvantage that the handling ability of the suspension board with circuit assembly sheet is reduced.

It is an object of the present invention to provide a suspension board with circuit assembly sheet that suppresses warping in a margin region and has excellent handling ability.

A suspension board with circuit assembly sheet of the present invention includes an assembly provided region having a plurality of suspension boards with circuits at spaced intervals to each other along one direction and a margin region having at least at one side in a crossing direction with respect to the one direction of the assembly provided region, wherein in the assembly provided region, a first opening portion is provided between the suspension boards with circuits that are adjacent to each other and in the margin region, a fragile portion is provided.

According to the suspension board with circuit assembly sheet, in the margin region, the fragile portion is provided, so that the stiffness of the margin region is capable of being reduced. Thus, a residual stress that may occur in the margin region in the suspension board with circuit assembly sheet is capable of being reduced. As a result, warping in the margin region is suppressed and furthermore, is capable of being prevented.

In the suspension board with circuit assembly sheet of the present invention, it is preferable that a metal supporting layer is further included and the fragile portion is formed by forming a second opening portion by partially removing the metal supporting layer in the margin region.

In the suspension board with circuit assembly sheet, the fragile portion is formed by forming the second opening portion by removing the metal supporting layer in the margin region. Thus, the stiffness of the margin region is surely reduced and in this way, the stiffness of the margin region is capable of corresponding to that of the assembly provided region. As a result, warping of the entire suspension board with circuit assembly sheet is capable of being prevented.

BRIEF DESCRIPTION OF THE DRAWINGS

FIG. 5A illustrating a step of preparing a metal supporting layer,

FIG. 5B illustrating a step of providing a base insulating layer,

FIG. 5C illustrating a step of providing a conductive layer, and

FIG. 5D illustrating a step of providing a cover insulating layer.

FIG. 8 shows a plan view of a margin region of a modified example (an embodiment in which second opening portions are in generally square shapes and are disposed in alignment in a longitudinal direction and a lateral direction) of the suspension board with circuit assembly sheet shown in FIG. 1.

FIG. 9 shows a plan view of a margin region of a modified example (an embodiment in which second opening portions are in generally square shapes and are disposed in alignment in a first inclined direction and a second inclined direction) of the suspension board with circuit assembly sheet shown in FIG. 1.

FIG. 10 shows a plan view of a margin region of a modified example (an embodiment in which second opening portions are in generally circular shapes and are disposed in alignment in a longitudinal direction and a lateral direction) of the suspension board with circuit assembly sheet shown in FIG. 1.

FIG. 11 shows a plan view of a margin region of a modified example (an embodiment in which second opening portions are in generally circular shapes and are disposed in alignment in a lateral direction, a first inclined direction, and a second inclined direction) of the suspension board with circuit assembly sheet shown in FIG. 1.

FIG. 12 shows a plan view of a margin region of a modified example (an embodiment in which second opening portions are in generally triangular shapes and are disposed in alignment in a longitudinal direction and a lateral direction and in which the same type of triangular portions are disposed in the longitudinal direction) of the suspension board with circuit assembly sheet shown in FIG. 1.

FIG. 13 shows a plan view of a margin region of a modified example (an embodiment in which second opening portions are in generally triangular shapes and are disposed in alignment in a lateral direction, a first inclined direction, and a second inclined direction and in which different types of triangular portions are disposed in the longitudinal direction) of the suspension board with circuit assembly sheet shown in FIG. 1.

DETAILED DESCRIPTION OF THE INVENTION

Figure 1:
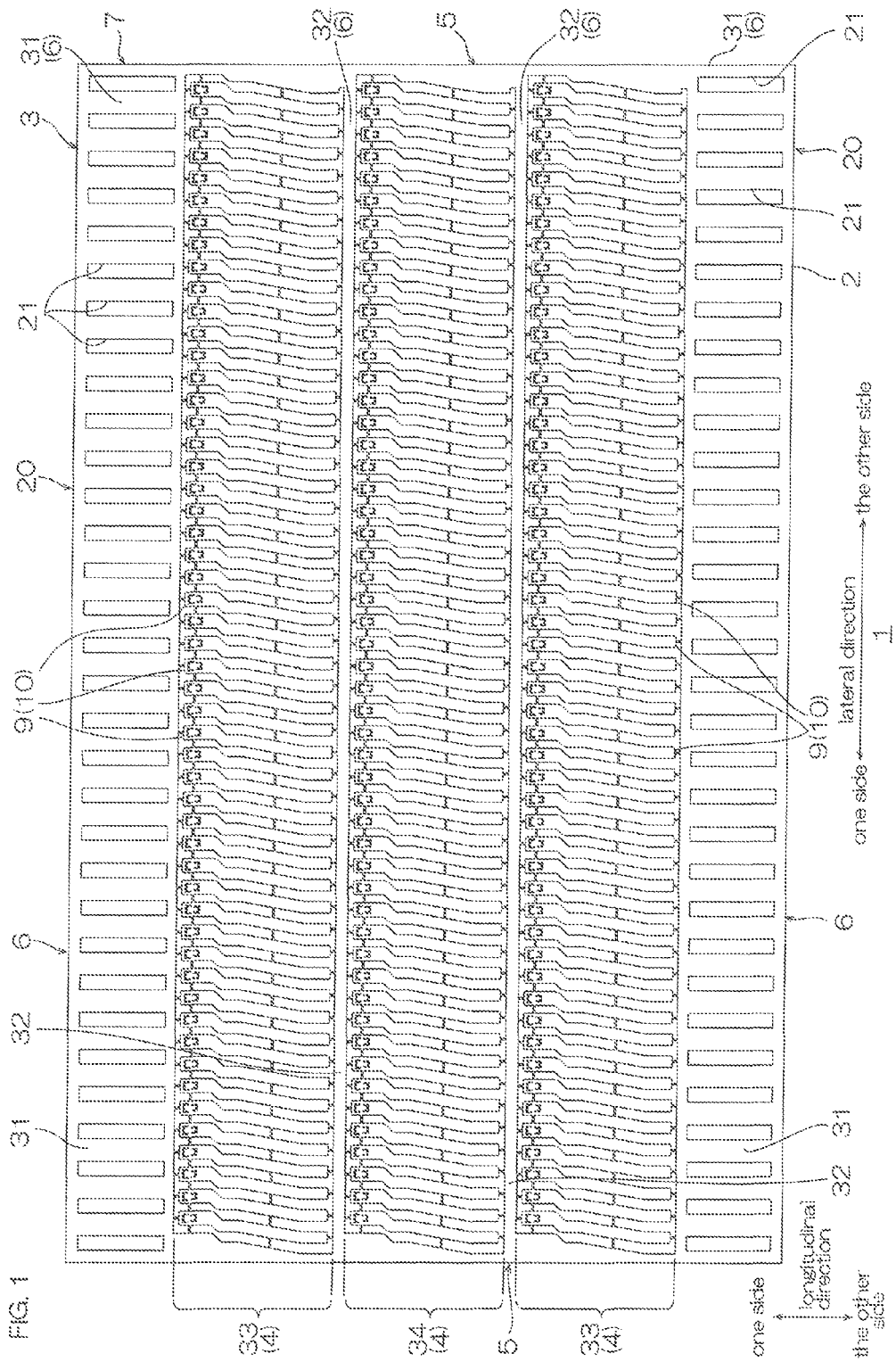
FIG. 1 shows a plan view of one embodiment of a suspension board with circuit assembly sheet of the present invention.

In FIG. 1, the up-down direction of the paper surface is referred to as a longitudinal direction (a first direction); the right-left direction of the paper surface is referred to as a lateral direction (a crossing direction with respect to the longitudinal direction, to be specific, a direction perpendicular to the longitudinal direction or a second direction orthogonal to the first direction and one example of one direction); and the depth direction of the paper surface is referred to as an up-down direction (a thickness direction or a third direction orthogonal to the first direction and the second direction).

Figure 2:
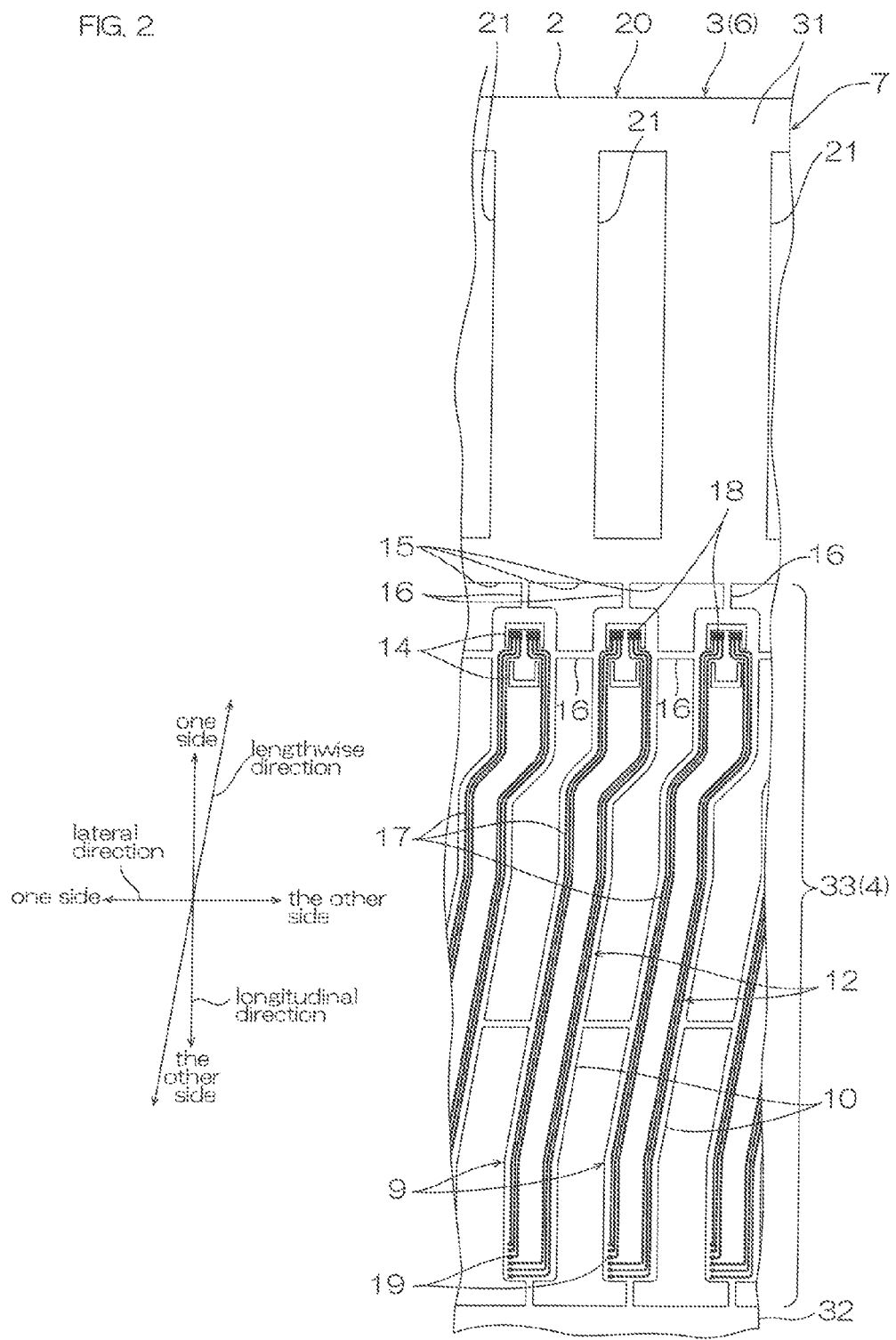
FIG. 2 shows an enlarged view of suspension boards with circuits and a margin region shown in FIG. 1.
Figure 3:
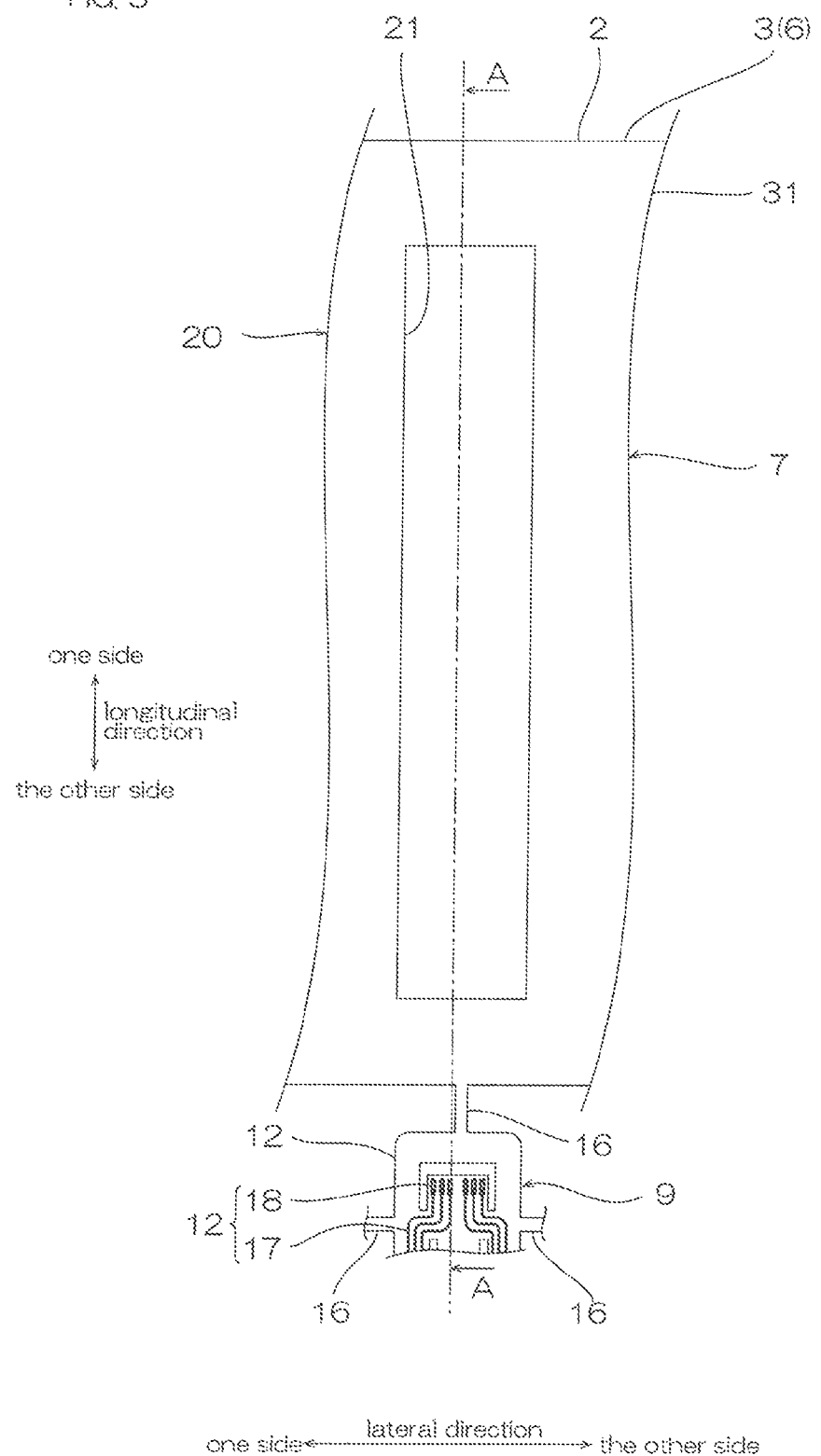
FIG. 3 shows an enlarged view of a front end portion of the suspension board with circuit and the margin region shown in FIG. 2.

In FIG. 1, in order to clearly show the shape of a metal supporting layer 2 to be described later, a base insulating layer 11, a conductive layer 12, and a cover insulating layer 13 to be described later are omitted. In FIGS. 2 and 3, in order to clearly show the relative arrangement of the metal supporting layer 2 and the conductive layer 12, the base insulating layer 11 and the cover insulating layer 13 to be described later are omitted.

Figure 4:
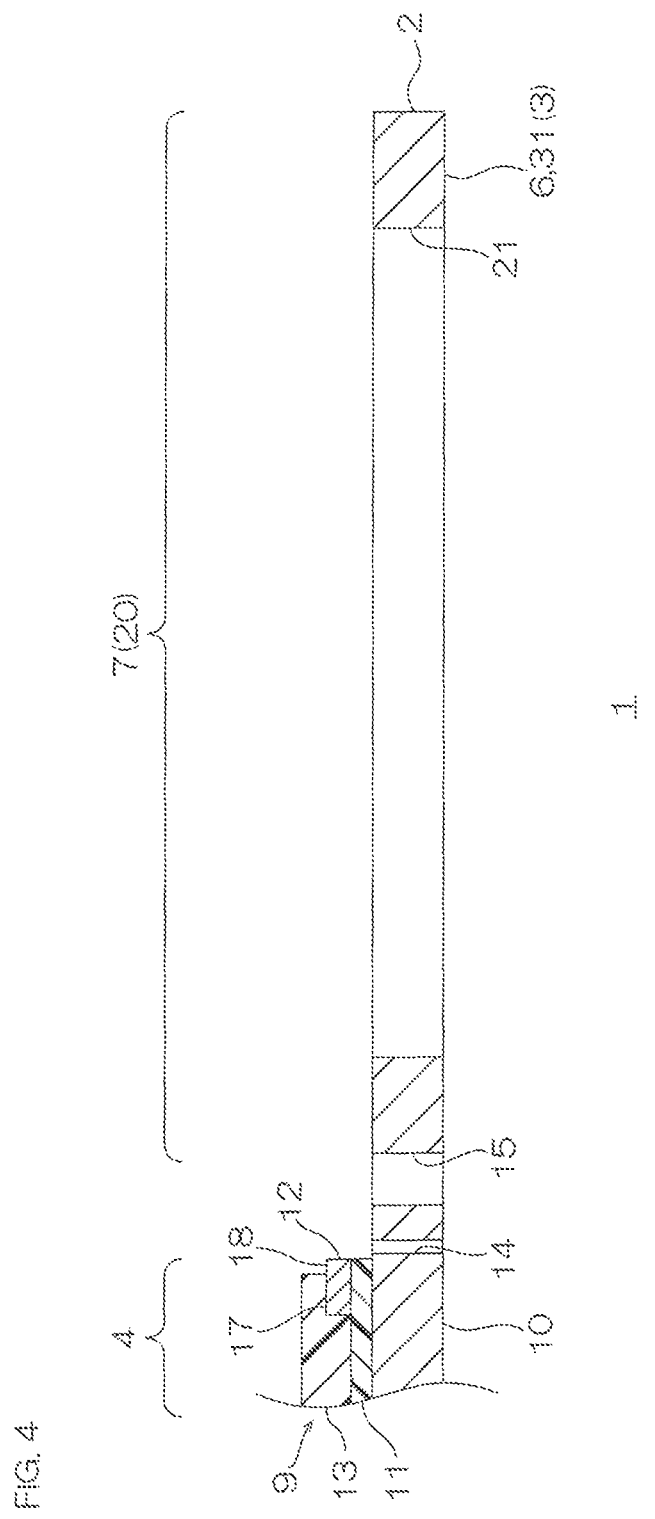
FIG. 4 shows a cross-sectional view along an A-A line shown in FIG. 3.

In FIG. 1, a suspension board with circuit assembly sheet 1 is capable of being obtained in the following manner: the base insulating layer 11, the conductive layer 12, and the cover insulating layer 13 (ref: FIG. 4) to be described later are sequentially provided on assembly provided regions 4 in the metal supporting layer 2 extending long in the lateral direction (to be specific, a conveying direction in a roll-to-roll method) by the roll-to-roll method and thereafter, the metal supporting layer 2 is trimmed.

The suspension board with circuit assembly sheet 1 is formed into a generally rectangular sheet shape extending in the lateral direction and is formed of the long-length metal supporting layer 2 by a single wafer method. The metal supporting layer 2 includes a support frame 3 and the assembly provided regions 4 that are provided at the inside of the support frame 3 and in which a plurality of suspension boards with circuits 9 are disposed in alignment.

The support frame 3 is provided at the circumference end portion of the metal supporting layer 2 and is formed into a long frame shape. The support frame 3 is provided with longitudinal frames 5 and lateral frames 6.

The longitudinal frames 5 are provided at both end portions in the lateral direction of the metal supporting layer 2. To be specific, two pieces of the longitudinal frames 5 are provided at spaced intervals to each other in the lateral direction. Each of the two pieces of the longitudinal frames 5 is formed into a generally rectangular shape in plane view extending in the longitudinal direction. The size of the longitudinal frame 5 is appropriately set corresponding to the size of the lateral frame 6 to be described next.

The lateral frames 6 connect the two pieces of the longitudinal frames 5 that are in opposed relation to each other in the lateral direction. A plurality (four pieces) of the lateral frames 6 are provided at spaced intervals to each other in the longitudinal direction of the support frame 3. To be specific, the lateral frames 6 are provided with one pair of first lateral frames 31 that are provided at both end portions in the longitudinal direction and second lateral frames 32 that are provided between (at the inside in the longitudinal direction of) the one pair of the first lateral frames 31 at spaced intervals thereto.

The first lateral frames 31 connect one end portion to the other end portion in the longitudinal direction of the one pair of the longitudinal frames 5. Each of the one pair of the first lateral frames 31 extends in the lateral direction and is formed into a generally rectangular shape in plane view that is long (wide) in length (width) in the longitudinal direction with respect to the second lateral frame 32. The first lateral frames 31 are defined as margin regions 7 that are provided at one side and the other side in the longitudinal direction of the assembly provided regions 4. The size of the first lateral frame 31 is described later.

The second lateral frames 32 connect the midway portions in the longitudinal direction of the one pair of the longitudinal frames 5. A plurality (two pieces) of the second lateral frames 32 are provided and are disposed at spaced intervals to each other in the longitudinal direction. Each of the plurality of the second lateral frames 32 is formed into a generally rectangular shape in plane view extending in the lateral direction. The second lateral frame 32 has a width (a length in the longitudinal direction) of, for example, 100 nm or more, or preferably 300 nm or more, and of, for example, 5000 nm or less, or preferably 4000 nm or less.

The assembly provided regions 4 are regions that are surrounded by the support frame 3. In the assembly provided regions 4, a plurality of the suspension boards with circuits 9 are provided at spaced intervals to each other. The assembly provided regions 4 are divided in the longitudinal direction by the second lateral frames 32. In this way, the assembly provided regions 4 include one pair of first provided regions 33 that are provided at both end portions in the longitudinal direction and a second provided region 34 that is provided between (at the inside in the longitudinal direction of) the one pair of the first provided regions 33 at spaced intervals thereto. Each of the one pair of the first provided regions 33 and the second provided region 34 is formed into a generally rectangular shape in plane view that is long in the lateral direction. In each of the one pair of the first provided regions 33 and the second provided region 34, the plurality of the suspension boards with circuits 9 are provided at spaced intervals to each other in the lateral direction. To be specific, in each of the one pair of the first provided regions 33 and the second provided region 34, the plurality of the suspension boards with circuits 9 are disposed in alignment in one line in the longitudinal direction and a myriad of lines in the lateral direction.

As shown in FIGS. 2 and 3, each of the plurality of the suspension boards with circuits 9 is formed into a generally flat belt shape extending in a lengthwise direction (a direction along a line segment that connects a central portion in the lateral direction of the front end portion to a central portion in the lateral direction of the rear end portion to be described later) thereof. The lengthwise direction of the suspension board with circuit 9 crosses the lateral direction and the longitudinal direction. To be specific, the lengthwise direction of the suspension board with circuit 9 slightly inclines with respect to the longitudinal direction.

As shown in FIG. 4, each of the plurality of the suspension boards with circuits 9 includes a metal supporting board 10, the base insulating layer 11 that is provided on the metal supporting board 10, the conductive layer 12 that is provided on the base insulating layer 11, and the cover insulating layer 13 that is provided on the base insulating layer 11 so as to cover the conductive layer 12.

As referred in FIGS. 1 and 5A to 5D, the metal supporting board 10, along with the support frame 3, is formed of the metal supporting layer 2 and is formed into a generally flat belt shape corresponding to the outer shape of the suspension board with circuit 9. As shown in FIG. 2, one pair of opening portions 14 that penetrate in the thickness direction are formed in each of the metal supporting boards 10. The one pair of the opening portions 14 are formed to have openings in generally U-shapes in plane view that sandwich head-side terminals 18 (described later) therebetween in the longitudinal direction. Also, gap grooves 15, as first opening portions, are formed around each of the metal supporting boards 10. The gap grooves 15 have openings by trimming the metal supporting layer 2.

The metal supporting boards 10 are connected to joint portions 16.

A plurality of the joint portions 16 are disposed at spaced intervals to each other in a circumferential direction of the metal supporting boards 10. Each of the plurality of the joint portions 16 is formed into a generally slender rectangular shape in plane view that goes from the circumferential edge of each of the metal supporting boards 10 outwardly (toward the inner edge of the support frame 3) and crosses each of the gap grooves 15 to be connected to the support frame 3 and the metal supporting board 10 that is adjacent thereto. The joint portions 16 are formed so as to be capable of being cut and support a plurality of the metal supporting boards 10 with respect to the support frame 3.

Examples of a metal that forms the metal supporting layer 2 including the metal supporting board 10 and the joint portion 16 include stainless steel and 42-alloy. Preferably, stainless steel is used. The metal supporting layer 2 has a thickness of, for example, 10 nm or more, or preferably 12 nm or more, and of, for example, 100 nm or less, or preferably 30 nm or less.

As shown in FIG. 4, the base insulating layer 11 is formed on the upper surface of the metal supporting board 10 into a pattern of corresponding to a portion in which the conductive layer 12 is formed. An example of an insulator that forms the base insulating layer 11 includes a synthetic resin such as polyimide, acryl, polyether nitrile, polyether sulfone, polyethylene terephthalate, polyethylene naphthalate, and polyvinyl chloride. Of these, preferably, a synthetic resin having photosensitivity is used, or more preferably, photosensitive polyimide is used. The base insulating layer 11 has a thickness of, for example, 1 nm or more, or preferably 3 nm or more, and of, for example, 30 nm or less, or preferably 15 nm or less.

As shown in FIG. 2, the conductive layer 12 integrally includes a plurality of wires 17 that are disposed in parallel at spaced intervals to each other and the head-side terminals 18 and external side terminals 19 that are continuous to the front end portions and the rear end portions of the wires 17, respectively. An example of a conductor that forms the conductive layer 12 includes a metal foil such as copper, nickel, gold, and solder or alloys thereof. Preferably, a copper foil is used. The conductive layer 12 has a thickness of, for example, 1 nm or more, or preferably 3 nm or more, and of, for example, 20 nm or less, or preferably 15 nm or less. Each of the wires 12 has a width of, for example, 5 nm or more, or preferably 10 nm or more, and of, for example, 500 nm or less, or preferably 300 nm or less. An interval between the wires 12 is, for example, 5 nm or more, or preferably 10 nm or more, and is, for example, 500 nm or less, or preferably 300 nm or less.

As shown in FIG. 4, the cover insulating layer 13 is formed into a pattern of covering the wire 12 and exposing the head-side terminal 18 and the external side terminal 19 (ref: FIG. 2) on the base insulating layer 11. An example of an insulator that forms the cover insulating layer 13 includes the same insulator as that of the above-described base insulating layer 11. Preferably, photosensitive polyimide is used. The cover insulating layer 13 has a thickness of, for example, 1 nm or more, or preferably 3 nm or more, and of, for example, 20 nm or less, or preferably 15 nm or less.

As shown in FIGS. 1 and 2, slits 21, as second opening portions, are provided in the margin regions 7 in the suspension board with circuit assembly sheet 1.

A plurality of the slits 21 are provided at spaced intervals to each other in the lateral direction in the margin regions 7. Each of the plurality of the slits 21 is formed into a generally rectangular shape in plane view extending in the longitudinal direction in the margin regions 7.

In the margin regions 7, by providing the plurality of the slits 21, fragile portions 20 that are more fragile than the case where the plurality of the slits 21 are not provided in the margin regions 7 are provided. The fragile portions 20 are provided over the entire margin regions 7. That is, the fragile portions 20 are formed into generally rectangular shapes in plane view that are long in the lateral direction including the above-described plurality of the slits 21 at one end portion and the other end portion in the longitudinal direction of the suspension board with circuit assembly sheet 1.

The size of the margin region 7 is appropriately set in accordance with the use and purpose of the suspension board with circuit assembly sheet 1. A length in the longitudinal direction of the margin region 7, that is, a length in the longitudinal direction of the first lateral frame 31 is, for example, 3000 nm or more, preferably 5000 nm or more, or more preferably 6000 nm or more, and is, for example, 40000 nm or less. The length in the longitudinal direction of the slit 21 with respect to the length in the longitudinal direction of the margin region 7 is, for example, 25% or more, preferably 30% or more, or more preferably 50% or more, and is, for example, 99% or less. To be specific, the slit 21 has a length in the longitudinal direction of, for example, 750 nm or more, preferably 900 nm or more, or more preferably 1500 nm or more, and of, for example, 39600 nm or less. Each of the slits 21 has a length in the lateral direction (a width) of, for example, 30 nm or more, preferably 40 nm or more, or more preferably 50 nm or more, and of, for example, 120000 nm or less, preferably 80000 nm or less, or more preferably 60000 nm or less. An interval between the slits 21 that are adjacent to each other is, for example, 30 nm or more, preferably 40 nm or more, or more preferably 50 nm or more, and is, for example, 100000 nm or less, preferably 80000 nm or less, or more preferably 60000 nm or less. In this way, the total area of the plurality of the slits 21 with respect to the area (the area of the fragile portions 20 including the area of the slits 21) of the fragile portions 20 in plane view is, for example, 10% or more, or preferably 15% or more, and is, for example, 80% or less, or preferably 70% or less. When the total area of the plurality of the slits 21 is above the above-described upper limit, there may be a case where the proportion of the metal supporting layer 2 that remains in the margin regions 7 becomes excessively little, so that the stiffness of the margin regions 7 is excessively reduced. Thus, there may be a case where the handling ability of the metal supporting layer 2 and furthermore, the suspension board with circuit assembly sheet 1 to be obtained is reduced. On the other hand, when the area of the fragile portions 20 is below the above-described lower limit, there may be a case where the proportion of the metal supporting layer 2 that remains in the fragile portions 20 becomes excessively large, so that a residual stress that may occur in the margin regions 7 is not capable of being reduced. Then, there may be a case where warping in the margin regions 7 is not capable of being effectively suppressed.

Next, a method for producing the suspension board with circuit assembly sheet 1 is described with reference to FIGS. 4 and 5A to 5D.

Figure 5:
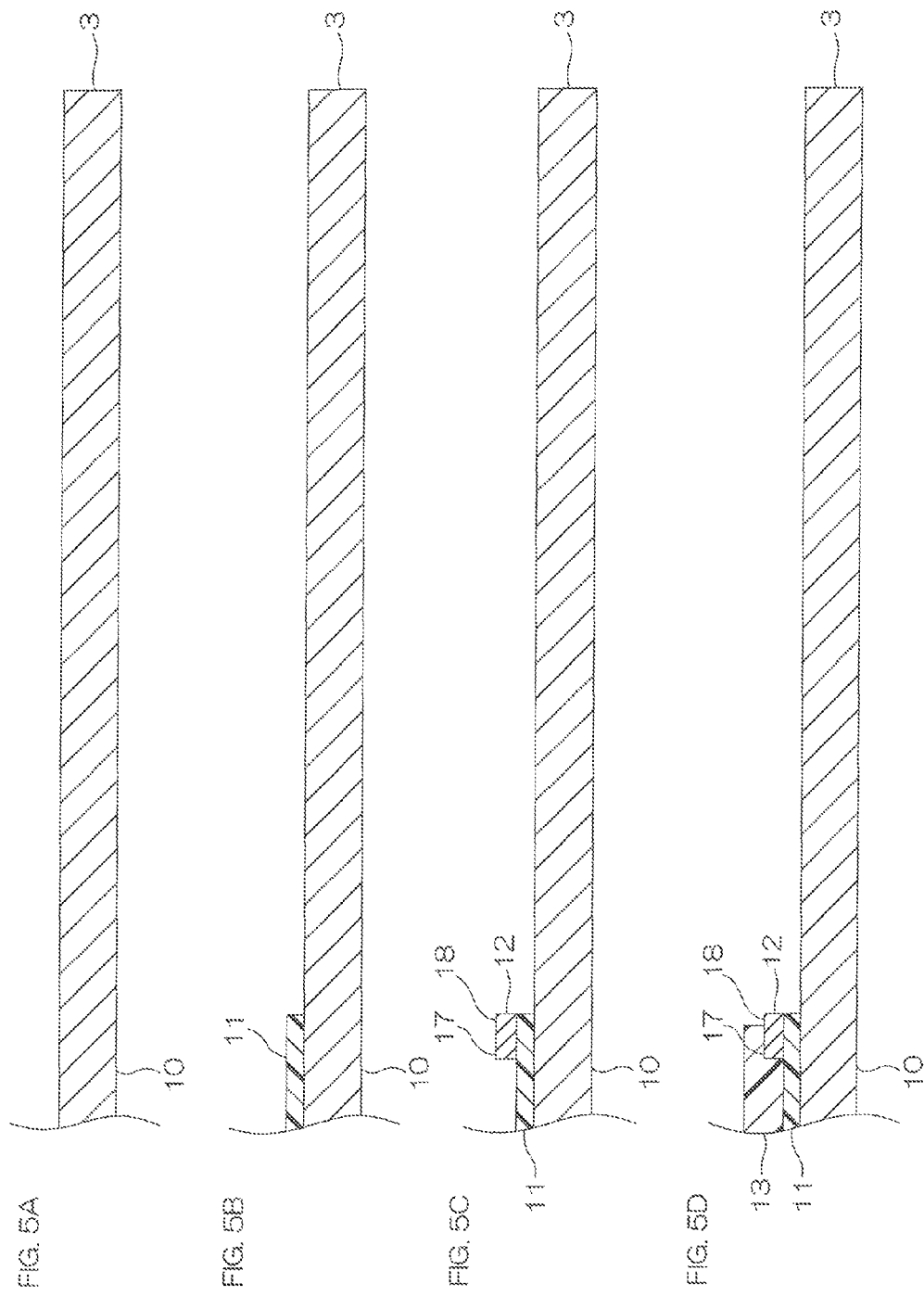
FIGS. 5A to 5D show process drawings for illustrating a method for producing the suspension board with circuit assembly sheet shown in FIG. 4.

As shown in FIG. 5A, in this method, first, the long-length metal supporting layer 2 is prepared. To be specific, as referred in FIG. 1, the metal supporting layer 2 that is wound around a roll (not shown) is conveyed in the lateral direction (the conveying direction), so that the metal supporting layer 2 that is long in the lateral direction is prepared.

Thereafter, as shown in FIGS. 5B to 5D, the base insulating layer 11, the conductive layer 12, and the cover insulating layer 13 are sequentially provided on the metal supporting layer 2.

That is, first, as shown in FIG. 5B, for example, a solution (a varnish) of a synthetic resin having photosensitivity is applied onto the entire upper surface of the metal supporting layer 2 to be then dried. Thereafter, the resulting laminate is exposed to light and developed to be then heated and cured as required. In this way, the base insulating layer 11 is provided on the metal supporting layer 2 in the above-described pattern.

Subsequently, as shown in FIG. 5C, the conductive layer 12 is provided on the base insulating layer 11 by, for example, a known patterning method such as additive method or subtractive method.

Next, as shown in FIG. 5D, for example, a solution (a varnish) of a synthetic resin having photosensitivity is applied onto the entire upper surfaces of the metal supporting layer 2, the base insulating layer 11, and the conductive layer 12 to be then dried. Thereafter, the resulting laminate is exposed to light and developed to be then heated and cured as required. In this way, the cover insulating layer 13 is provided on the base insulating layer 11 in the above-described pattern. That is, the cover insulating layer 13 is provided so as to expose the head-side terminals 18 and the external side terminals 19 (ref: FIG. 2).

Also, each of the base insulating layer 11, the conductive layer 12, and the cover insulating layer 13 is provided so as to expose the support frame 3, to be specific, at least the upper surface of the margin region 7.

Next, as shown in FIG. 4, the opening portion 14, the gap groove 15, and the slit 21 are simultaneously provided in the metal supporting layer 2. In order to provide the opening portion 14, the gap groove 15, and the slit 21 in the metal supporting layer 2, the metal supporting layer 2 is partially removed to be trimmed. To be specific, the metal supporting layer 2 is processed to have openings by, for example, an etching method such as dry etching (for example, plasma etching) or wet etching (for example, chemical etching), drilling, or laser processing. In this way, the metal supporting board 10 corresponding to the suspension board with circuit 9 is formed. Also, in this way, the suspension board with circuit assembly sheet 1 in a single wafer state is obtained.

As shown in FIG. 1, in the suspension board with circuit assembly sheet 1, the support frame 3 is provided in the metal supporting layer 2 and the plurality of the suspension boards with circuits 9 are produced in the assembly provided regions 4. At the same time with this, in the margin regions 7, the plurality of the slits 21 are provided, so that the fragile portions 20 are provided.

In this manner, the suspension board with circuit assembly sheet 1 is produced.

According to the suspension board with circuit assembly sheet 1, in the margin regions 7, the fragile portions 20 are provided, so that the stiffness of the margin regions 7 is capable of being reduced. Thus, a residual stress that may occur in the margin regions 7 in the suspension board with circuit assembly sheet 1 is capable of being reduced. As a result, warping in the margin regions 7 is suppressed and furthermore, is capable of being prevented.

In the suspension board with circuit assembly sheet 1, the fragile portions 20 are formed by forming the plurality of the slits 21 by removing the metal supporting layer 2 in the margin regions 7. Thus, the stiffness of the margin regions 7 is surely reduced and in this way, the stiffness of the margin regions 7 is capable of corresponding to that of the assembly provided regions 4.

As a result, warping of the entire suspension board with circuit assembly sheet 1 is capable of being prevented.

Modified Example

Each of the modified examples of the suspension board with circuit assembly sheet 1 is described with reference to FIGS. 6 to 14. In each modified example, the same reference numerals are provided for members corresponding to each of those in the above-described embodiment, and their detailed description is omitted.

Figure 6:
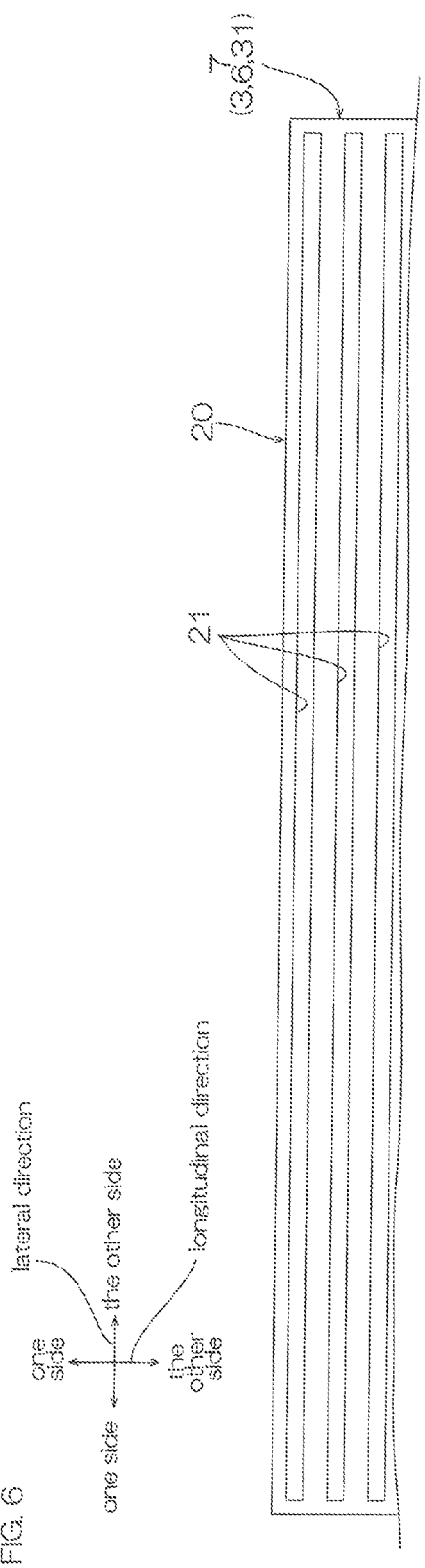
FIG. 6 shows a plan view of a margin region of a modified example (an embodiment in which slits extend in a lateral direction) of the suspension board with circuit assembly sheet shown in FIG. 1.

In the embodiment in FIG. 1, each of the slits 21 is formed into a shape extending in the longitudinal direction. Alternatively, for example, as shown in FIG. 6, each of the slits 21 is also capable of being formed into a shape extending in the lateral direction. A plurality (three pieces) of the slits 21 are provided at spaced intervals to each other in the longitudinal direction in each of the first lateral frames 31 (the margin regions 7).

Figure 7:
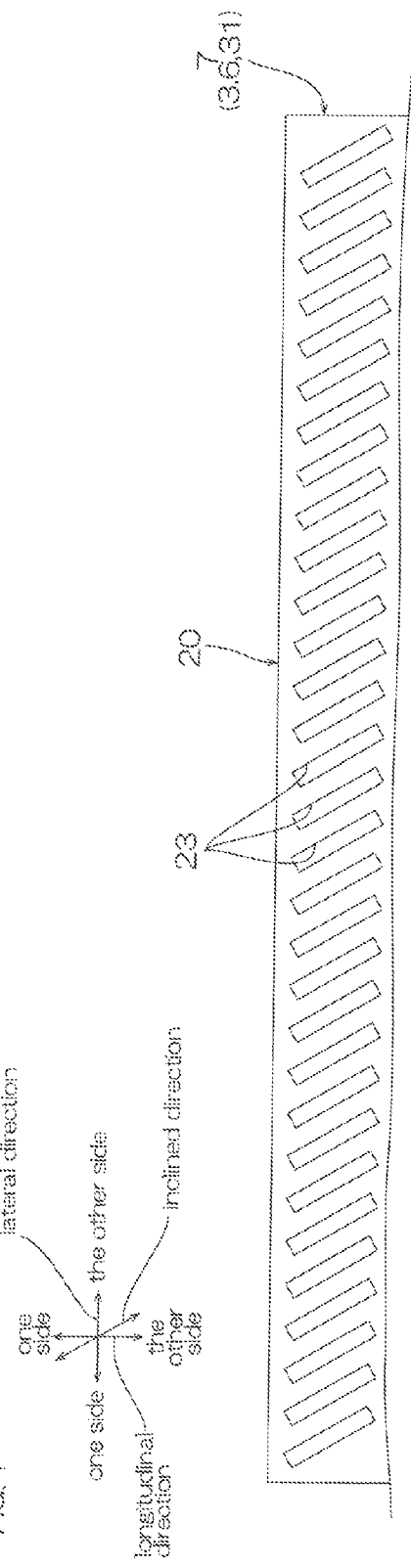
FIG. 7 shows a plan view of a margin region of a modified example (an embodiment in which slits extend in an inclined direction) of the suspension board with circuit assembly sheet shown in FIG. 1.

Alternatively, for example, as shown in FIG. 7, each of the slits 21 is also capable of being formed into a shape that inclines with respect to the longitudinal direction and the lateral direction. To be specific, each of the plurality of the slits 21 is formed into a shape along an inclined direction that gradually inclines to one side in the lateral direction toward one side in the longitudinal direction. The plurality of the slits 21 are disposed at spaced intervals to each other in the lateral direction.

In the embodiment in FIG. 1, as one example of the second opening portions of the present invention, the slits 21 in generally rectangular shapes in plane view are formed in the margin regions 7 and the shape thereof is not limited. For example, as shown in FIGS. 8 and 9, second opening portions 23 in generally square shapes in plane view are also capable of being formed in the margin region 7. Also, as shown in FIGS. 10 and 11, the second opening portions 23 in generally circular shapes in plane view are capable of being formed in the margin region 7. Also, as shown in FIGS. 12 and 13, the second opening portions 23 in generally triangular shapes in plane view are capable of being formed in the margin region 7.

In FIG. 8, the second opening portions 23 are formed into generally square shapes in plane view and a plurality of the second opening portions 23 are disposed in alignment at spaced intervals to each other in the longitudinal direction and the lateral direction. The metal supporting layer 2 in the fragile portions 20 is formed into a generally lattice shape in plane view (a generally grid shape in plane view) along the longitudinal direction and the lateral direction by the plurality of the second opening portions 23.

In FIG. 9, the second opening portions 23 are formed into generally square shapes in plane view and the plurality of the second opening portions 23 are disposed in alignment at spaced intervals to each other in a first inclined direction that inclines with respect to the longitudinal direction and the lateral direction and in a second inclined direction (an inclined direction that gradually inclines to the other side in the lateral direction toward one side in the longitudinal direction) that crosses (in FIG. 9, is orthogonal to) the first inclined direction (to be specific, an inclined direction that gradually inclines to one side in the lateral direction toward one side in the longitudinal direction). The metal supporting layer 2 in the fragile portion 20 is formed into a generally lattice shape in plane view (a generally grid shape in plane view) along the first inclined direction and the second inclined direction by the plurality of the second opening portions 23.

In FIG. 10, the second opening portions 23 are formed into generally circular shapes in plane view and the plurality of the second opening portions 23 are disposed in alignment at spaced intervals to each other in the longitudinal direction and the lateral direction.

In FIG. 11, the second opening portions 23 are formed into generally circular shapes in plane view. The plurality of the second opening portions 23 are disposed in alignment at spaced intervals to each other (in a staggered state) in the lateral direction, the first inclined direction, and the second inclined direction.

In FIGS. 12 and 13, the second opening portions 23 are formed into generally triangular shapes in plane view and the plurality of the second opening portions 23 are disposed in alignment at spaced intervals to each other in the longitudinal direction and the lateral direction. The second opening portions 23 that are adjacent to each other in the lateral direction include first triangular portions 24 in which one apex of three apexes of each of triangles goes toward one side in the longitudinal direction and second triangular portions 25 in which one apex of three apexes of each of triangles goes toward the other side in the longitudinal direction. In this way, the first triangular portions 24 and the second triangular portions 25 are alternately disposed in the lateral direction.

In FIG. 12, in the longitudinal direction, the same type of triangular portions (the first triangular portions 24 or the second triangular portions 25) are disposed in parallel.

On the other hand, in FIG. 13, in the longitudinal direction, different types of triangular portions are alternately disposed. To be specific, in the longitudinal direction, the first triangular portions 24 and the second triangular portions 25 are alternately disposed in parallel.

In the embodiments in FIGS. 1, 12, and 13, the second opening portions 23 are, in plane view, formed into generally rectangular shapes (generally quadrangular shapes) or generally triangular shapes. Alternatively, for example, though not shown, the second opening portions 23 are also capable of being formed into generally polygonal shapes (for example, generally pentagonal shapes, generally hexagonal shapes, or the like) excluding the above-described generally quadrangular shapes and generally triangular shapes.

In the above-described embodiment in FIG. 1, the assembly provided regions 4 are divided into three pieces in the longitudinal direction. Alternatively, for example, the assembly provided regions 4 are also capable of being divided into two pieces or four or more pieces.

Furthermore, in the above-described embodiment in FIG. 1, the assembly provided regions 4 are divided into a plurality of pieces in the longitudinal direction. Alternatively, for example, though not shown, the assembly provided region 4 is also capable of being formed as one region in the longitudinal direction without being divided. In such a case, though not shown, the lateral frame 6 includes the first lateral frames 31 only without including the second lateral frame 32. That is, the margin regions 7 are disposed in adjacent to both sides in the longitudinal direction of the assembly provided region 4.

In the embodiment in FIG. 1, the margin regions 7 in which the slits 21 are provided are provided in both two pieces of the first lateral frames 31. Alternatively, for example, though not shown, the margin region 7 in which the slits 21 are provided is also capable of being provided in one first lateral frame 31 only. That is, the margin region 7 is disposed in adjacent to one side only in the longitudinal direction of the assembly provided regions 4.

Figure 14:
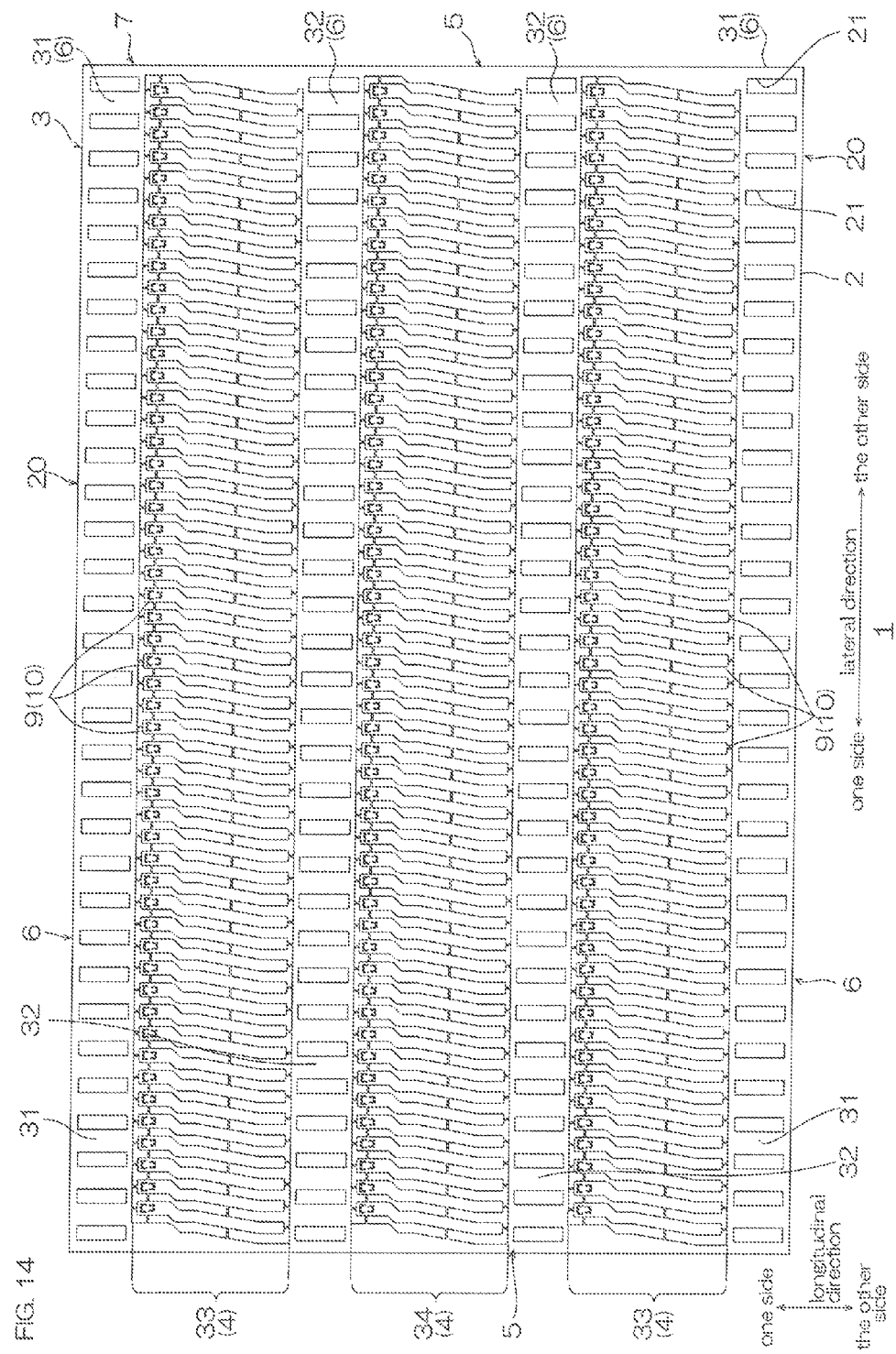
FIG. 14 shows a plan view of a modified example (an embodiment in which first lateral frames and second lateral frames are margin regions) of the suspension board with circuit assembly sheet shown in FIG. 1.

In the embodiment in FIG. 1, the first lateral frame 31 is defined as the margin region 7. Alternatively, for example, as shown in FIG. 14, in addition to the first lateral frame 31, the second lateral frame 32 is also capable of being defined as the margin region 7 in which the slits 21 are provided. Or, the second lateral frame 32 only is also capable of being defined as the margin region 7 in which the slits 21 are provided.

Furthermore, in the embodiments in FIGS. 1 and 4, the fragile portions 20 are formed by forming the slits 21 that penetrate in the thickness direction in the metal supporting layer 2. Alternatively, for example, though not shown, the fragile portions 20 are also capable of being formed by forming a concave portion that dents midway in the thickness direction. That is, the concave portion is formed as a thin portion that is thinner in thickness than a portion other than the concave portion. The shape of the concave portion in plane view is formed as the same as that of the slit 21 and that of the second opening portion 23 described above.

In the embodiment in FIG. 1, the fragile portions 20 are provided over the entire margin regions 7. Alternatively, for example, though not shown, the fragile portions 20 are also capable of being provided in a part in the lateral direction of the margin regions 7. For example, the fragile portion 20 is capable of being provided in one only among one end portion in the lateral direction, the other end portion in the lateral direction, and a midway portion in the lateral direction.

In the embodiment in FIG. 1, the suspension board with circuit assembly sheet 1 is produced by a single wafer method. Alternatively, for example, though not shown, the suspension board with circuit assembly sheet 1 is also capable of being produced by a long-length method of being wound around a roll.

The above-described each of the modified examples is capable of being appropriately combined with the above-described embodiment. In such a case, the same function and effect as that of the above-described embodiment is capable of being achieved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit assembly sheet comprising:
    an assembly provided region having a plurality of suspension boards with circuits at spaced intervals to each other along one direction; and
    a margin region provided at an end portion at least at one side in a crossing direction with respect to the one direction of the assembly provided region, wherein
    the suspension board with circuit includes a metal supporting board, a base insulating layer that is provided on the metal supporting board, a conductive layer that is provided on the base insulating layer, and a cover insulating layer that is provided on the conductive layer,
    the margin region is made only of a metal supporting layer,
    in the assembly provided region, a first opening portion is provided between the suspension boards with circuits that are adjacent to each other,
    the first opening portion is formed so as to surround the suspension board with circuit,
    in the margin region, a fragile portion is provided,
    the assembly provided region further comprises a first joint portion which goes from the suspension board with circuit to cross the first opening portion and to be connected to the margin region, and a second joint portion which goes from the suspension board with circuit to cross the first opening portion in the one direction and to be connected to another suspension board with circuit that is adjacent to the suspension board with circuit in the one direction,
    the fragile portion is formed by forming a second opening portion by partially removing the metal supporting layer in the margin region, and
    the suspension board with circuit and the another suspension board with circuit are connected only by the second joint portion in the one direction.

2. The suspension board with circuit assembly sheet according to claim 1, wherein
    the second opening portion includes a plurality of the second opening portions, and
    the plurality of the second opening portions are provided at spaced intervals to each other in the one direction.

3. The suspension board with circuit assembly sheet according to claim 1, wherein the first joint portion extends toward the crossing direction.

4. The suspension board with circuit assembly sheet according to claim 1, wherein
    the second joint portion includes a plurality of the joint portions.

5. The suspension board with circuit assembly sheet according to claim 1, wherein the second opening portion includes a plurality of the second opening portions, each of the second opening portions being formed into a generally rectangular shape that is long in plan view in the crossing direction.

6. The suspension board with circuit assembly sheet according to claim 1, wherein the second opening portion includes a plurality of the second opening portions, each of the second opening portions being formed to incline in the one direction and in the crossing direction.

* * * * *